United States Patent [19]
Sato et al.

[11] Patent Number: 5,703,530
[45] Date of Patent: Dec. 30, 1997

[54] RADIO FREQUENCY AMPLIFIER HAVING IMPROVED CTB AND CROSS MODULATION CHARACTERISTICS

[75] Inventors: Yuzo Sato; Katsumi Kaneko; Yasushi Saito, all of Saitama, Japan

[73] Assignee: Yagi Antenna Co., Ltd., Tokyo, Japan

[21] Appl. No.: 623,700

[22] Filed: Mar. 29, 1996

[30] Foreign Application Priority Data

Oct. 6, 1995 [JP] Japan .................................. 7-259841

[51] Int. Cl.$^6$ ................................................ H03F 1/32
[52] U.S. Cl. ............................................ 330/149; 333/138
[58] Field of Search ...................................... 330/107, 110, 330/124 R, 149, 165; 333/81 A, 81 R, 100, 136, 138

[56] References Cited

U.S. PATENT DOCUMENTS 5,523,716  6/1996  Grebliunas et al. ...................... 330/149

FOREIGN PATENT DOCUMENTS 61-179606  8/1986  Japan ...................................... 330/149

*Primary Examiner*—Steven Mottola
*Attorney, Agent, or Firm*—Sughrue, Mion, Zinn, Macpeak & Seas, PLLC

[57] ABSTRACT

A radio-frequency amplifier circuit of simple construction having low power consumption and low heat generation and which amplifies an input signal while maintaining composite triple beat (CTB) distortion, type cross modulation distortion at a minimum, is provided. The radio-frequency amplifier comprises a transformer which transforms an input signal from an unbalanced state to a balanced state. The amplifier further comprises at least one distortion generation circuit including a first circuit having a nonlinear element and a first delay line coupled in series, and a second circuit having an attenuation element and a second delay line coupled in series. The first and second circuits are coupled in parallel. At least one distortion generation circuit is coupled to an input, an output, and/or an intermediate point of a radio-frequency amplification stage of the radio-frequency amplifier. The first and second delay lines are configured to create a delay time change in a signal input level of a signal input to the radio-frequency amplification stage which opposes a delay time change in the signal input level caused by a delay time difference between the input and output of the radio-frequency amplification stage. A transformer transforms the amplified input signal from the balanced state back to an unbalanced state before outputting the amplified signal from the amplifier circuit.

37 Claims, 5 Drawing Sheets

VECTOR OF CURRENT Id FOLLOWING THROUGH DIODE

VECTOR OF CURRENT Ia FOLLOWING THROUGH ATTENUATION ELEMENT

RADIO FREQUENCY AMPLIFIER HAVING IMPROVED CTB AND CROSS MODULATION CHARACTERISTICS

BACKGROUND OF THE INVENTION

1. Field of the Invention

The present invention relates to a radio-frequency amplifier for amplifying broadband radio-frequency signals, such as cable television (CATV) signals, being transmitted through a transmission line, with minimal CTB and cross modulation distortion.

2. Description of the Related Art

A conventional transmission line system using a coaxial line, such as a CATV system, includes amplifiers disposed at proper intervals which amplify the signals being transmitted to compensate for attenuation of the signals which occurs throughout the line. CATV signals typically have a frequency band ranging from 70 MHz to 450 MHz, for example, which is equivalent to about 60 channels. Generally, when the signals are amplified, a single broadband amplification is performed without dividing frequencies into bands.

The amplifiers are installed along the transmission line at about 20 dB apart (in terms of the normal attenuation value of the signals being transmitted), which is equal to about 500 m apart in terms of distance. Accordingly, in a large-scale system, the number of cascaded stages of amplifiers can be approximately 30 or more in order to maintain the required signal quality in terms of the signal-to-noise ratio, the signal-to-distortion ratio, etc., throughout the transmission line. Therefore, it is important that the amplifiers used in the system have good noise and distortion characteristics in order to maximize the distance that the signals can be transmitted and thus maximize the service area that can be covered by the system.

However, even if amplifiers having good operating characteristics are used, other distortion, such as cross modulation distortion, typically can occur in such a system. Cross modulation distortion occurs when the modulated (i.e., amplitude modulated) contents of a channel interferes with and becomes commingled with that of other channels. Other types of distortion, such as CTB (composite triple beat) distortion, appears as low-frequency interference on a video signal. That is, distortion components resulting from adding and subtracting frequencies of carriers occur in the proximity of each carrier because channel carriers are equally spaced from each other on the frequency axis. CTB type distortion is considered more problematic with an increase in the number of channels, because although cross modulation distortion increases in proportion to the number of channels, CTB distortion increases almost in proportion to $_nC_3$ ($_nC_3$ represents the number of possible combinations of combining three channels among n number of channels).

A push-pull circuit can be used to suppress distortion in amplifier such as second-order distortion. However, it is difficult to completely remove distortion of odd orders, such as third-order distortion which causes the above-mentioned cross modulation distortion and CTB distortion. Hence, CTB distortion becomes a factor limiting the performance of the amplifiers and the overall size of the CATV system.

In addition, along with an increase in the number of channels, as well as an increase in the upper limit of frequency bands, in recent years, it has been discovered that the cross modulation distortion involves not only interference between amplitude modulation contents of channels, but also includes a phase modulation (PM) component. This type of cross modulation occurs because the input and output levels of the amplifiers are not completely proportional to each other, and also because the output level is suppressed in response to a higher input level. In other words, this type of cross modulation has nonlinearity in that the gain decreases at a higher input level.

Accordingly, when the amplitude of one channel increases during modulation, the gain of the amplification circuit decreases and the amplitude of another channel is decreased. The modulation signal is thus transferred in an inverted form, causing cross modulation. Hence, in an amplifier which amplifies a number of channels at the same time, cross modulation is observed as an interference wave image which appears as a negative image.

To measure cross modulation distortion in a conventional system, one channel is placed in a nm-modulation state and all other channels are placed in a modulation state. A signal is then passed through an amplifier, and the level of modulation that occurs on each channel with no modulation on its output is observed. The following two methods for detecting the modulation level can therefore be used.

Envelope detection can be used to check the amplitude of the modulation waveform. Alternatively, a spectrum analyzer can be used to separate a carrier and side-bands on the frequency axis to check their relationship with each other. If the cross modulation that is occurring is only pure amplitude modulation, the results of the two measurement methods should match. However, due to the phase modulation (PM) component of the cross modulation, the results typically do not match, and as the frequency increases, so does the difference between the measurements. That is, at high measurement frequencies, the modulation measured by envelop detection usually is less than the amplitude modulation calculated from the side-band level measured with a spectrum analyzer.

It is therefore presumed that the occurring side-band is caused not only by amplitude modulation, but also by phase modulation. Again, as described above, the phase modulation occurs because the delay time between input and output of the amplification circuit changes relative to the input level, rather than due to the nonlinearity of the gain relative to the input level.

For example, assuming that a −80 dB side-band occurs relative to the carrier level at 450 MHz and is caused purely by phase modulation, fluctuation of the delay time caused by input level change is about 0.07 picoseconds. This exceeds the resolution that can be measured with normal group delay measuring devices and hence, it is not an amount of change that can be recognized by direct measurement.

On the other hand, with a side-band generated by pure amplitude modulation, the composite of upper and lower side-band vectors matches the carrier vector, and only the amplitude changes. The phase does not change. In pure phase modulation, however, the upper and lower side-band vectors are orthogonal to the carrier vector and only the carrier phase changes. That is, the amplitude does not change.

Cross modulation actually occurring in the amplification circuit, however, is considered as simultaneous occurrence of both amplitude modulation and phase modulation, with the phase modulation that occurs based on a certain delay time fluctuation becoming larger as the frequency rises. Therefore, the difference between the results of the measuring methods described above increases, because the spectrum analyzer measurement captures only the side-band level relationship and cannot identify the phase relationship.

Even though during cross modulation, amplitude modulation and phase modulation occurs at the same time, signals currently transmitted by a CATV system are standard television signals in which information is carried only by an amplitude change. Hence, attention is due only to amplitude components, and phase modulation components may be ignored.

However, it is presumed that soon, a modulation system which transmits digital television signals will be available, and hence, both the phase and amplitude of the signals will become an important factor. Moreover, it is highly probably that CATV systems will divide the frequency band between the current analog television signals and the digital signals, and mix them. It is also probable that CATV systems will be used not only for television signal transmission, but also as telephone and data communication lines. Accordingly, it is likely that the phase modulation component of cross modulation will become problematic.

An example of a conventional amplification circuit which attempts to reduce signal distortion and is included in an amplifier used in the systems discussed above will now be described with reference to FIG. 6. A signal input to an input terminal 11 is transformed into a balanced state from an unbalanced state by an input unbalanced-balanced transformer 12, and undergoes push-pull amplification by transistors 13, 14, 15, and 16.

The signal is then restored to the unbalanced state by an output balanced-unbalanced transformer 20, and is output from an output terminal 21. Resistors 17, 18, and 19 provide a negative feedback circuit for providing a flat gain characteristic relative to frequencies. Actually, a circuit for providing a bias potential to the transistors 13, 14, 15, and 16 and capacitive or inductive elements to adjust the frequency characteristics of the amplifier circuit are also required, but are omitted here. The gain of the amplification circuit is normally 10 and several dB.

An amplifier used in a conventional transmission system typically uses amplification circuits such as basic units at both its input and output. Circuits, such as a variable attenuation circuit for achieving automatic gain control (AGC) to compensate a cable loss that changes with temperature, as well as a variable equalization circuit for achieving automatic slope control (ASC) to compensate for gain which increases relative to frequency, are disposed between the amplification circuits.

That is, signals are processed in the order of amplification-attenuation-amplification, and the operation is performed to achieve a desired gain. The amplification circuit bias condition is of the class-A operation, and power consumption normally is about 4–12 watts per amplification circuit. The amplifier output level is 32 millivolts per channel of television signals, namely, about 13 microwatts relative to 75-ohm transmission line impedance, and does not exceed 1 milliwatt as the total electric power for 60 channels.

For the distortion performance of a single amplifier provided under the above conditions, cross modulation and CTB are typically −85 dB or so. For example, if 10 stages of the amplifier are cascaded, their third-order distortions are added as voltage, thus resulting in 20 dB degradation to −65 dB. If 30 stages are cascaded, about 30 dB degradation to −55 dB or so is experienced.

The technical criteria of the cable television service law in Japan stipulates that a CATV system must operate with cross modulation of only −42 dB or less occurring throughout the entire area serviced by the CATV system. Also, it has become easier sense distortion interference due to upsizing receivers, etc., in recent years, and hence, a better quality signal than that required by law is desired. Accordingly, the demand for low-distortion performance is growing more and more as amplifier performance increases.

Conventionally, a parallel operation technique and a feedforward technique can be implemented in conventional amplifiers to improve their distortion characteristics. In the parallel operation technique, the same amplification circuits are operated in parallel to cut the signal power handled by each amplification circuit in half, thus reducing distortion. However, such a technique requires that twice as much power be consumed while only improving third-order distortion by about 6 dB.

In the feedforward technique, a difference between a part of an input signal of a main amplification circuit and a part of an output signal is determined so that only a distortion component can be extracted. This distortion component is properly amplified by an auxiliary amplification circuit, then is combined with a distortion component of the output of the main amplification circuit, so that the two distortion components cancel each other to thereby improve the distortion characteristic of the amplifier. The improvement in the distortion characteristic by the feedforward technique is generally greater than that by the parallel operation technique.

However, in the feedforward technique, the power consumed by the auxiliary amplification circuit is comparable to that consumed by the main amplification circuit. Moreover, the circuitry is complicated and large-scaled. For these reasons, the overall costs associated with the system is increased.

SUMMARY OF THE INVENTION

It is therefore an object of the present invention to provide a radio-frequency amplifier having improved CTB and cross modulation characteristics with respect to both amplitude and phase modulation components, to thereby improve the transmission quality of both analog and digital television signals. It is a further object of the invention to achieve this improvement with less increase in power consumption when compared to other distortion improvement techniques, such as the parallel operation technique and the feedforward technique.

To achieve the above objects, the invention provides a radio-frequency amplifier including a distortion generation circuit. The distortion generation circuit comprises a circuit having a nonlinear element and a first delay line placed in series, and a circuit having an attenuation element and a second delay line placed in series. The circuits are disposed in parallel to each other.

The distortion generation circuit is connected to the input and/or output of a radio-frequency amplification stage in series with the direction is in which a signal passing through the amplification stage is transmitted. The first and second delay lines are configured to create a delay time change in a signal input level of a signal input to the radio-frequency amplification stage which opposes a delay time change in the signal input level caused by a delay time difference between the input and output of the radio-frequency amplification stage.

Also, in the present invention, is the distortion generation circuit is placed in an intermediate point of the amplification elements, thus making up a radio-frequency amplification stage. That is, in the present invention, amplitude type cross modulation, which typically occurs in conventional amplification circuits due to nonlinearity of a saturation characteristic in which gain decreases with an input level increase, as well as phase type cross modulation which occurs due to a delay time change between an input and output relative to an input level change, are cancelled by a circuit placed outside or inside the amplification circuit. That is, the circuit is placed at either or both the output and input of the amplification circuit, or alternatively, between amplification element stages of the amplification circuit.

The circuit of the present invention as described above generates a distortion equal in amplitude and opposite in phase to a distortion component generated by an amplification circuit preceding, following, or during amplification, and thus cancels distortion at the output of the amplification circuit, thereby improving characteristics of the amplification circuit.

In addition, method called predistortion is generally known to improve nonlinear distortion of amplifiers other than CATV amplifiers, such as microwave band travelling wave tube amplifiers, or laser diodes used for electricity-light conversion for optical communication. The operation of the predistortion is to supply a predistorted signal to a travelling wave tube or a laser diode, thereby canceling distortion at output of the device. This method is not applied to CATV amplifiers because a predistortion generation circuit provides excessive loss and therefore is impractical in this application.

Accordingly, another object of the present invention is to generate an opposite-phase distortion component not only at a stage preceding amplification, but also, at a stage following amplification, or even during the amplification process.

BRIEF DESCRIPTION OF THE DRAWINGS

These and other objects and advantages of the invention will become more apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

Figure 1:
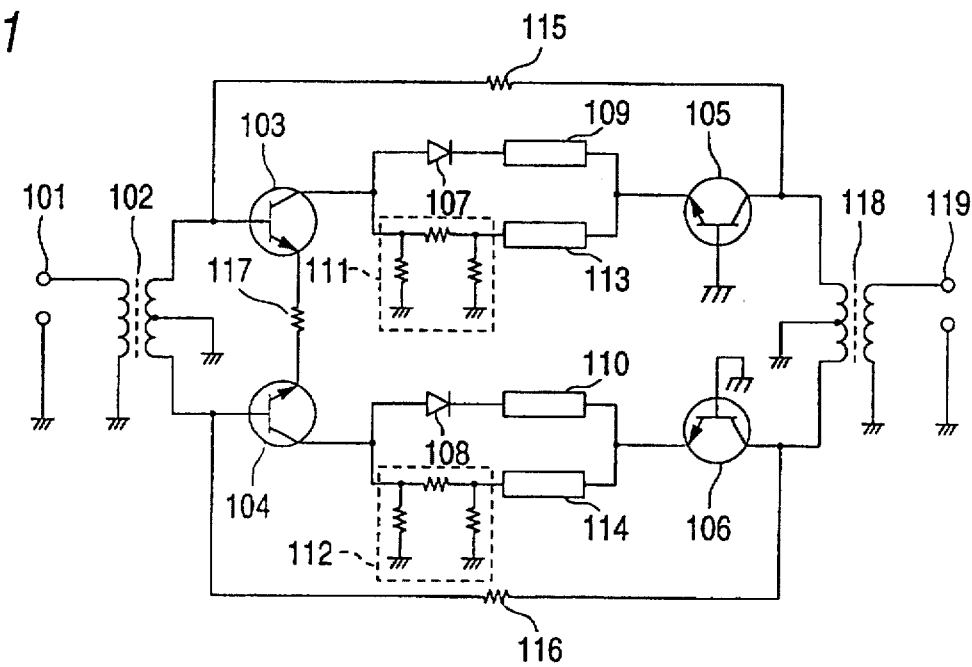
FIG. 1 is a circuit diagram of a radio-frequency amplifier according to a first embodiment of the invention.

FIG. 1 is a circuit diagram showing a radio-frequency amplifier according to a first embodiment of the invention. A signal input to an input terminal 101 is transformed into a balanced state from an unbalanced state by an input unbalanced-balanced transformer 102, and undergoes push-pull amplification by transistors 103, 104, 105, and 106, which can be any suitable type of transistors.

A circuit comprising a nonlinear element 107, such as a diode, a transistor, or the like, and a delay line 109 coupled in series with each other, and a circuit comprising an attenuation element 111 and a delay line 113 coupled in series with each other, are disposed in parallel between the transistors 103 and 105 which perform an amplification operation. Likewise, a circuit comprising a nonlinear element 108 and a delay line 110 disposed in series with each other, and a circuit comprising an attenuation element 112 and a delay line 114 disposed in series with each other, are disposed in parallel between transistors 104 and 106 for performing opposite-phase amplification in the push-pull operation.

A resistor 115, acting as a negative feedback circuit, is connected between input (base) of the transistor 103 and output (collector) of the transistor 105. Likewise, a resistor 116, acting as the negative feedback circuit, is connected between input (base) of the transistor 104 and output (collector) of the transistor 106.

The push-pull-amplified signal is restored to the unbalanced state by an output balanced-unbalanced transformer 118, and is output at an output terminal 119.

In this embodiment, circuits 111 and 112 are illustrated as π-type attenuation circuits using three resistors as the attenuation elements. However, if, for example, impedance matching is not strictly required, the two resistors connected to ground may be omitted, and one resistor inserted in the signal passage direction can replace the attenuation circuit. Further, with regard to each non-linear element 107 and 108, more than one diode may be connected in series depending on the required degree of distortion. The diode or diodes need(s) to be set to an optimum condition because the distortion amount varies depending on the magnitude of flowing DC bias current. Also, although a circuit for applying a bias to the diodes is not shown, a bias can be easily applied by properly combining radio-frequency shut-off by a choke coil and DC shut-off by a capacitor.

Figure 2:
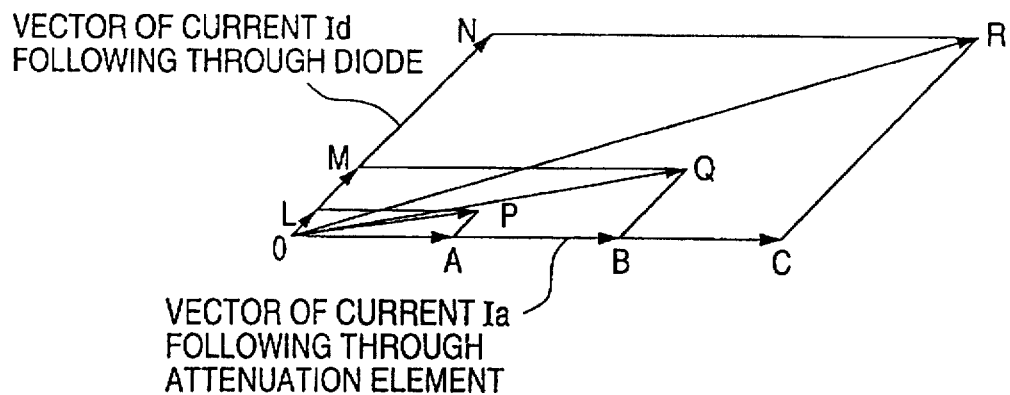
FIG. 2(a) is a vector diagram illustrating the operation of a distortion generation circuit as in the embodiment shown in FIG. 1.
FIG. 2(b) illustrates a distortion generation circuit such as that shown in the embodiment of FIG. 1.
Figure 2:
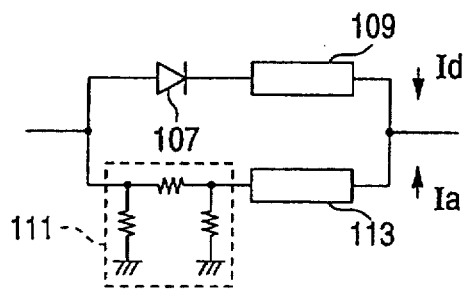

The operation of the circuit shown in FIG. 1 will be discussed with reference to FIGS. 2(a) and 2(b). FIG. 2(a) is a vector diagram showing vectors of radio-frequency currents flowing through the circuit made up of the diode, the attenuation element, and the two delay lines, as illustrated in FIGS. 1 and 2(b). As shown in FIG. 2(b), current Id passes through the diode 107 and delay line 109 to the confluence, and current Ia passes through the attenuation element 111 and delay line 111 to the confluence.

If the delay time of the delay line 113 is set longer than that of the delay line 109, the phase of current Id thus leads that of current Ia. If the input voltage is changed to three stages at equal intervals, the vector of current Ia flowing through the attenuation element 111 changes to OA, OB, and OC, at equal intervals. On the other hand, the vector of current Id flowing through the diode 107 changes to OL, OM, and ON almost exponentially due to nonlinearity of the forward current versus the voltage of the diode 107, while maintaining the phase angle leading that of the current Ia constant. The change is opposite to the saturation characteristic, and the output current is thus extended for a higher input level.

Next, the total current vector resulting from the current Ia and current Id merging with each other on the output side becomes OP, OQ, OR, the amplitude of which, namely, the vector length, changes nonlinearly and phase angle change responsive to the input level. The nonlinear distortion component amount of the amplitude at the confluence can be selected as desired according to the attenuation amount of the attenuation element 111 and the bias condition of the diode 107 to cancel out the saturation characteristic distortion of the transistor of the amplification element. The phase angle change relative to the input level can be cancelled by selecting the delay time difference between the two delay lines 109 and 113, namely, the angle between current Id and current Ia, so that it can be made opposite to the delay time change relative to the input level of the amplification circuit. Accordingly, the amplitude modulation component and phase modulation component that is present during the cross modulation phenomenon described above can be canceled out. The above-mentioned CTB caused by third-order distortion like the cross modulation can also be canceled out.

As shown in FIG. 2(b), two delay lines 109 and 113 are present. As described above, the delay lines generate a delay time difference between current Id and current Ia. However, this still can be accomplished if one of the delay lines is omitted. The delay time change to be canceled out is several-hundredth picoseconds and hence, components having an electrical length of 10 microns can have an effect on the delay time. Regardless of the components that are used, their electrical length cannot be zero. It is presumed, therefore, that the delay line has an electrical length which is sufficient to affect the delay time, while enabling the delay line to be connected to, for example, a circuit board or component package.

Figure 3:
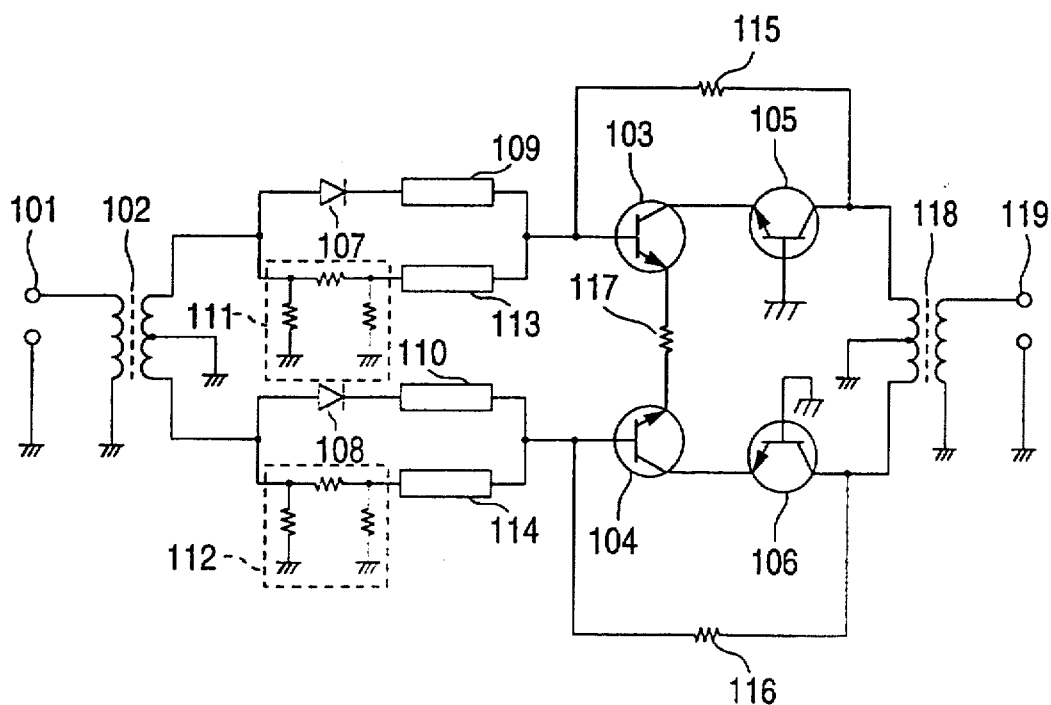
FIG. 3 is a circuit diagram showing a second embodiment of the invention.

FIG. 3 is a circuit diagram showing a radio-frequency amplifier according to a second embodiment of the invention. In the second embodiment, distortion generation circuits, such as those described above with respect to FIGS. 1, 2(a) and 2(b), are placed between the input unbalanced-balanced transformer 102 and the transistor 103, and between the input unbalanced-balanced transformer 102 and a transistor 104. The operation of the distortion generation circuit is similar to that of the circuit in FIG. 1.

In comparing the radio-frequency amplifier shown in FIG. 3 with the circuit in FIG. 1, since the distortion generation circuit is placed outside transistors 103-106 and resistors 115, 116, and 117 of a negative feedback circuit, the delay time of the distortion generation circuit itself does not affect the operation of the negative feedback circuit, and hence, the radio-frequency amplifier can operate on a wider frequency band. Also, the noise degradesin porportion to the loss of the distortion generation circuit as in the circuit of FIG. 1.

Figure 4:
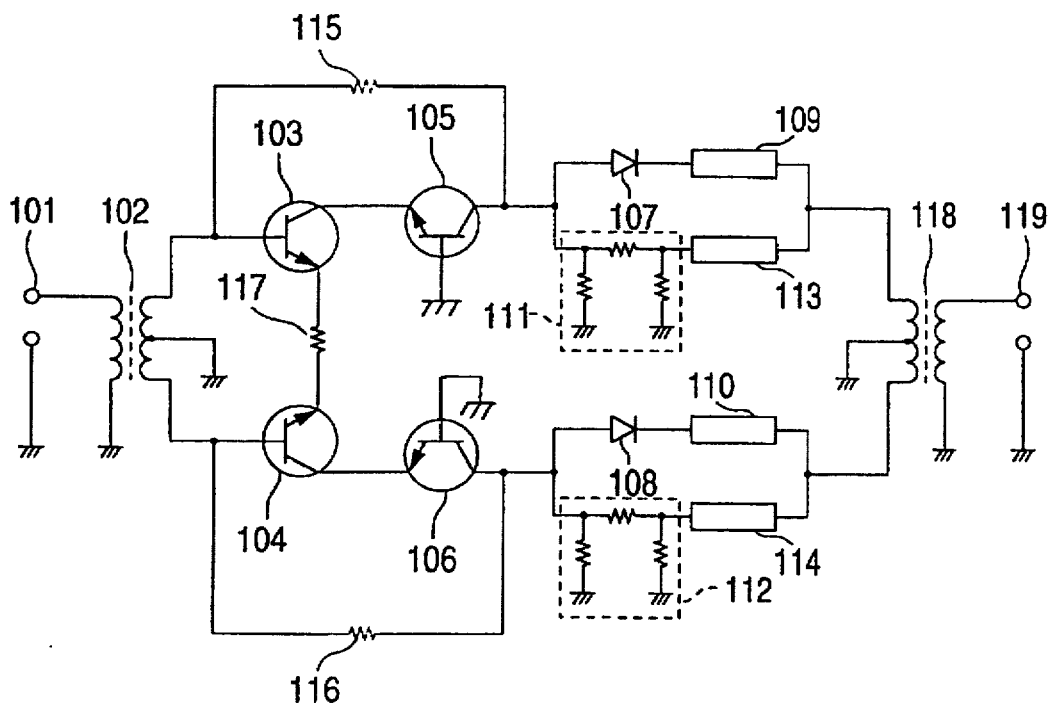
FIG. 4 is a circuit diagram showing a third embodiment of the invention.

FIG. 4 is a circuit diagram showing a radio-frequency amplifier according to a third embodiment of the invention. In the third embodiment, distortion generation circuits, such as those described above with respect to FIGS. 1-3, are placed between the transistor 105 and the output balanced-unbalanced transformer 118, and between the transistor 106 and the output balanced-unbalanced transformer 118. Hence, distortion at the amplification stage is canceled out by generating opposite-phase distortion at the following stage.

Generally, third-order distortion is mainly odd'th-order distortion in the distortion factor range in which a CATV signal amplifier operates, and fifth-order or higher-order distortion typically can be ignored. Therefore, if the output level is raised by a certain dB value in the distortion factor range, the value of cross modulation and CTB relative to a signal degrades by twice the dB value. In the circuit in FIG. 4, the output from the amplification stage needs to be raised as much as the loss of the distortion generation circuit, so that the distortion generated at the amplification stage degrades. However, the loss of the distortion generation circuit can be suppressed to 1 dB or so, and improvement of 10 dB or more can be easily provided by canceling out the distortion.

Figure 7:
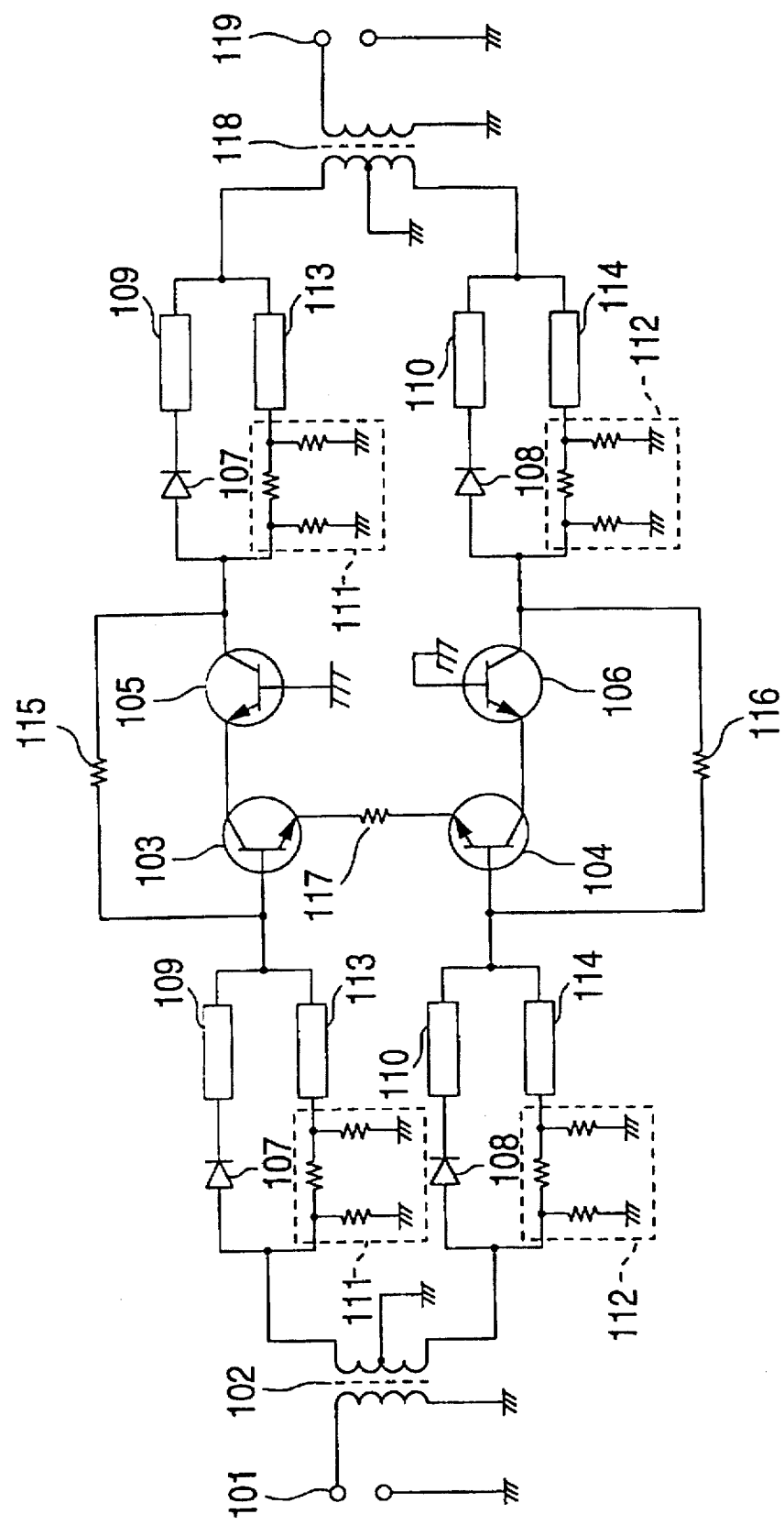
FIG. 7 is a circuit diagram showing a combination of the circuits of the second and third embodiments as shown in FIG. 3 and 4.

As an alternative embodiment as shown in FIG. 7, the circuits illustrated in FIGS. 3 and 4 may be combined so that the distortion generation circuits are placed on both the input and output sides of the amplification stage to therefore cancel out the distortion on both sides of the amplification circuit. Also, the circuits of FIGS. 1, 3 and 4 can be combined so that distortion generation circuits are present and both the input and output sides of the amplification circuit, as well as between transistors 103 and 105, and 104 and 106, as shown in FIG. 1. The circuits shown in FIGS. 1, 3, and 4, of course, differ in signal level handled by the distortion generation circuits and, therefore, differ in the number of diodes connected in series, the magnitude of bias current caused to flow into the diodes, etc. Any suitable number of diodes, as well as any suitable bias current or voltage, can be used.

Figure 5:
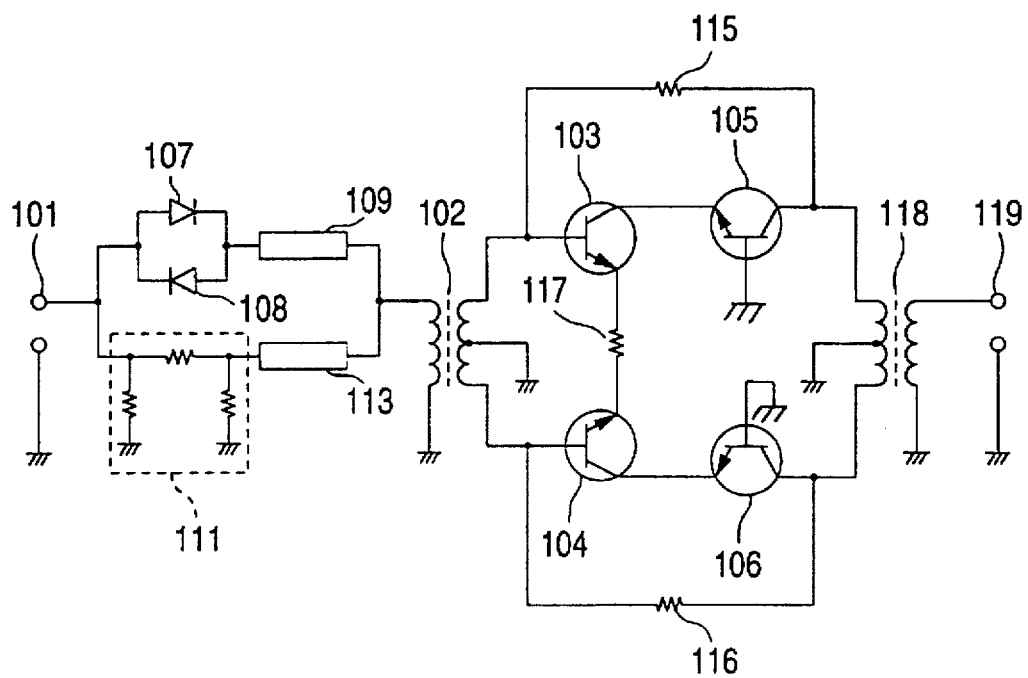
FIGS. 5A and 5B are circuit diagram showing a fourth embodiment of the invention.
Figure 5:
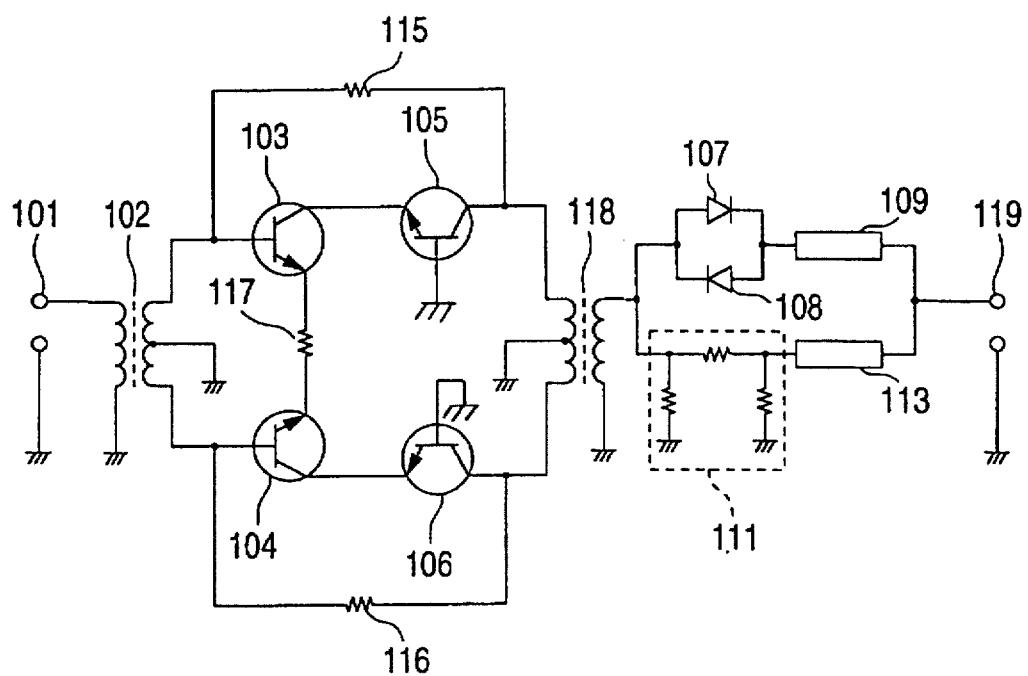
Figure 6:
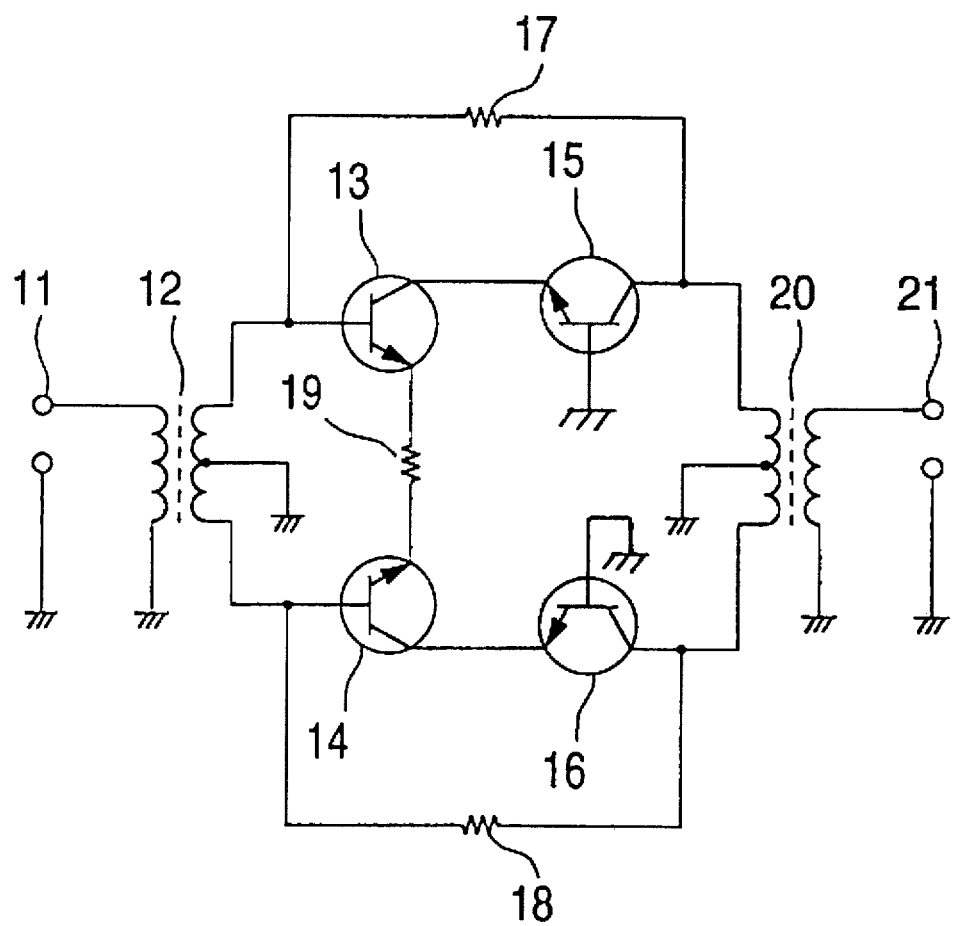
FIG. 6 is a circuit diagram showing the configuration of a conventional radio-frequency amplifier.

FIG. 5A is a circuit diagram showing a radio-frequency amplifier according to a fourth embodiment of the invention. In the fourth embodiment, a distortion generation circuit, such as that described with reference to FIGS. 1-4, is placed between the unbalanced side, namely, the input terminal 101 and an unbalanced-balanced transformer 102. The embodiment differs from the first to third embodiments in that two diodes 107 and 108 are connected so as to be opposite in a direction to each other relative to the signal passage direction. The diodes 107 and 108 thus perform symmetrical operation with respect to the positive and negative cycles of the input signal, thereby suppressing generation of even'th-order distortion. Accordingly, canceling-out of even'th-order distortion by the push-pull operation of the following amplification section (i.e, transistors 103-106) is not affected. The distortion generation operation is similar to that previously described with reference to FIG. 2(b).

Alternatively, as shown in FIG. 5B a distortion generation circuit similar to that shown in FIG. 5A may be placed between the balanced-unbalanced transformer 118 and the output terminal 119. Such a distortion generation circuit can also be placed on both input and output sides, as well as between transistors 103-106.

In the embodiments discussed above, it should be noted that the amount opposite-phase distortion required to cancel out distortion of about −80 dB, for example, in CATV amplifiers, is small. Accordingly, although for illustration purposes, the vector of current Id is drawn large in FIG. 2(a), its amplitude is actually only about several hundredths as that of the current Ia. Therefore, most of input signal power can be sent out to the output, because the attenuation of the input signal caused by the attenuation element is small, and the entire attenuation value of the distortion generation circuit can be easily set to 1 dB or less. Accordingly, since only such a small degree of attenuation is needed, the design and construction of the amplifiers is not hindered.

Additionally, an increase in entire power consumption of the amplifier due to the addition of the distortion generation circuit is only due to the bias current that is necessary to bias the diodes in the circuit, which is several milliamperes at most. This is much less than the additional power consumption needed in the conventional parallel amplification circuit operation method, described above, in which the amplification circuits each normally consume current ranging from 150 to 500 milliamperes, or than in the conventional feed-forward technique using an auxiliary amplification circuit requiring the same amount of additional current.

These embodiments are explained without other circuits, and may be included as a part of an integrated circuit (IC).

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A radio-frequency amplifier comprising:

at least one distortion generation circuit including a first circuit having a nonlinear element and a first delay line coupled in series, and a second circuit having an attenuation element and a second delay line coupled in series, said first and second circuits being coupled in parallel;

said at least one distortion generation circuit is coupled to at least one of an input and an output of a radio frequency amplification stage of said radio-frequency amplifier, and said first and second delay lines are configured to create a delay time change in a signal input level of a signal input to said radio-frequency amplification stage which opposes a delay time change in said signal input level caused by a delay time difference between said input and output of said radio-frequency amplification stage.

2. A radio-frequency amplifier as claimed in claim 1, comprising two of said distortion generation circuits, both of which being coupled to said input of said radio-frequency amplification stage.

3. A radio-frequency amplifier as claimed in claim 1, comprising two of said distortion generation circuits, both of which being coupled to said output of said radio-frequency amplification stage.

4. A radio-frequency amplifier as claimed in claim 1, comprising four of said distortion generation circuits, two of which being coupled to said input of said radio-frequency amplification stage and the other two of which being coupled to said output of said radio-frequency amplification stage.

5. A radio-frequency amplifier as claimed in claim 1, wherein said non-linear element is a diode and said attenuation element comprises a plurality of resistors arranged in a π-type circuit.

6. A radio-frequency amplifier as claimed in claim 1, further comprising at least one of the following:

a first transformer coupling said input of said radio-frequency amplification stage to said at least one distortion generation circuit; and a second transformer coupling said output of said radio-frequency amplification stage to said at least one distortion generation circuit.

7. A radio-frequency amplifier as claimed in claim 1, further comprising at least one of the following:

a first transformer, said at least one distortion generation circuit coupling said input of said radio-frequency amplification stage to said first transformer; and a second transformer, said at least one distortion generation circuit coupling said output of said radio-frequency amplification stage to said second transformer.

8. A radio-frequency amplifier as claimed in claim 1, wherein said at least one distortion generation circuit is coupled to said at least one of said input and output in series with a signal propagation direction of said input signal through said radio-frequency amplification stage.

9. A radio-frequency amplifier as claimed in claim 1, wherein said at least one distortion generation circuit reduces at least one of composite triple beat (CTB) distortion, amplitude type cross modulation distortion, and phase type cross modulation distortion of said input signal propagating through said amplifier.

10. A radio-frequency amplifier comprising:

at least one distortion generation circuit including a first circuit having a nonlinear element and a first delay line coupled in series, and a second circuit having an attenuation element and a second delay line coupled in series, said first and second circuits being coupled in parallel;

said at least one distortion generation circuit is coupled at an intermediate point between amplification devices of a radio-frequency amplification stage, and said first and second delay lines are configured to create a delay time change in a signal input level of a signal input to said radio-frequency amplification stage which opposes a delay time change in said signal input level caused by a delay time difference between said input and output of said radio-frequency amplification stage.

11. A radio-frequency amplifier as claimed in claim 10, comprising two of said distortion generation circuits, both of which being coupled to said intermediate point.

12. A radio-frequency amplifier as claimed in claim 10, wherein said at least one distortion generation circuit is coupled to at least one of an input and an output of a radio-frequency amplification stage of said radio-frequency amplifier.

13. A radio-frequency amplifier as claimed in claim 10, wherein said non-linear element is a diode and said attenuation element comprises a plurality of resistors arranged in a π-type circuit.

14. A radio-frequency amplifier as claimed in claim 10, wherein said at least one distortion generation circuit is coupled at said intermediate point in series with a signal propagation direction of said input signal through said radio-frequency amplification stage.

15. A radio-frequency amplifier as claimed in claim 10, wherein said at least one distortion generation circuit reduces at least one of composite triple beat (CTB) distortion, amplitude type cross modulation distortion, and phase type cross modulation distortion of said input signal propagating through said amplifier.

16. A distortion generation circuit, for use with a radio-frequency amplifier, comprising:

a first circuit having a nonlinear element and a first delay line coupled in series; and a second circuit having an attenuation element and a second delay line coupled in series, said first and second circuits being coupled in parallel, wherein said first and second circuits have different delay times with respect to each other.

17. A distortion generation circuit as claimed in claim 16, wherein said non-linear element is a diode and said attenuation element comprises a plurality of resistors arranged in a π-type circuit.

18. A method for reducing at least one of amplitude type cross modulation distortion, phase type cross modulation distortion and composite triple beat (CTB) distortion of an input signal propagating through a radio-frequency amplifier, comprising the steps of:

amplifying said input signal to create and amplified signal;

generating a distortion in said input signal at least one of at time prior to amplifying said input signal, during amplification of said input signal, and after amplifying said input signal, to effect a delay time in a signal input level of said input signal to oppose a delay time change in said signal input level caused by a delay time difference between an input and output of said radio-frequency amplifier; and outputting said amplified signal from said radio-frequency amplifier.

19. A method as claimed in claim 18, further comprising the step of transforming said input signal from an unbalanced state into a balanced state at least one of prior to and after generating distortion in said input signal.

20. A method as claimed in claim 19, wherein said input signal is amplified during said amplification step in said balanced state, and further comprising the step of transforming said amplified signal from said balanced state to an unbalanced state prior to outputting said amplified signal.

21. An integrated circuit comprising a radio-frequency amplifier circuit, said radio-frequency amplifier including:

at least one distortion generation circuit including a first circuit having a nonlinear element and a first delay line coupled in series, and a second circuit having an attenuation element and a second delay line coupled in series, said first and second circuits being coupled in parallel;

said at least one distortion generation circuit is coupled to at least one of an input and an output of a radio-frequency amplification stage of said radio-frequency amplifier, and said first and second delay lines are configured to create a delay time change in a signal input level of a signal input to said radio-frequency amplification stage which opposes a delay time change in said signal input level caused by a delay time difference between said input and output of said radio-frequency amplification stage.

22. An integrated circuit as claimed in claim 21, comprising two of said distortion generation circuits, both of which being coupled to said input of said radio-frequency amplification stage.

23. An integrated circuit as claimed in claim 21, comprising two of said distortion generation circuits, both of which being coupled to said output of said radio-frequency amplification stage.

24. An integrated circuit as claimed in claim 21, comprising four of said distortion generation circuits, two of which being coupled to said input of said radio-frequency amplification stage and the other two of which being coupled to said output of said radio-frequency amplification stage.

25. An integrated circuit as claimed in claim 21, wherein said non-linear element is a diode and said attenuation element comprises a plurality of resistors arranged in a π-type circuit.

26. An integrated circuit as claimed in claim 21, further comprising at least one of the following:

a first transformer coupling said input of said radio-frequency amplification stage to said at least one distortion generation circuit; and a second transformer coupling said output of said radio-frequency amplification stage to said at least one distortion generation circuit.

27. An integrated circuit as claimed in claim 21, further comprising at least one of the following:

a first transformer, said at least one distortion generation circuit coupling said input of said radio-frequency amplification stage to said first transformer; and a second transformer, said at least one distortion generation circuit coupling said output of said radio-frequency amplification stage to said second transformer.

28. An integrated circuit as claimed in claim 21, wherein said at least one distortion generation circuit is coupled to said at least one of said input and output in series with a signal propagation direction of said input signal through said radio-frequency amplification stage.

29. An integrated circuit as claimed in claim 21, wherein said at least one distortion generation circuit reduces at least one of composite triple beat (CTB) distortion, amplitude type cross modulation distortion, and phase type cross modulation distortion of said input signal propagating through said amplifier.

30. An integrated circuit comprising a radio-frequency amplifier circuit, said radio-frequency amplifier including:

at least one distortion generation circuit including a first circuit having a nonlinear element and a first delay line coupled in series, and a second circuit having an attenuation element and a second delay line coupled in series, said first and second circuits being coupled in parallel;

said at least one distortion generation circuit is coupled at an intermediate point between amplification devices of a radio-frequency amplification stage, and said first and second delay lines are configured to create a delay time change in a signal input level of a signal input to said radio-frequency amplification stage which opposes a delay time change in said signal input level caused by a delay time difference between said input and output of said radio-frequency amplification stage.

31. An integrated circuit as claimed in claim 30, comprising two of said distortion generation circuits, both of which being coupled to said intermediate point.

32. An integrated circuit as claimed in claim 30, wherein said at least one distortion generation circuit is coupled to at least one of an input and an output of a radio-frequency amplification stage of said radio-frequency amplifier.

33. An integrated circuit as claimed in claim 30, wherein said non-linear element is a diode and said attenuation element comprises a plurality of resistors arranged in a π-type circuit.

34. An integrated circuit as claimed in claim 30, wherein said at least one distortion generation circuit is coupled at said intermediate point in series with a signal propagation direction of said input signal through said radio-frequency amplification stage.

35. An integrated circuit as claimed in claim 30, wherein said at least one distortion generation circuit reduces at least one of composite triple beat (CTB) distortion, amplitude type cross modulation distortion, and phase type cross modulation distortion of said input signal propagating through said amplifier.

36. An integrated circuit comprising a distortion generation circuit, said distortion circuit comprising:

a first circuit having a nonlinear element and a first delay lined coupled in series; and a second circuit having an attenuation element and a second delay line coupled in series, said first and second circuits being coupled in parallel, wherein said first and second circuits have different delay times with respect to each other.

37. An integrated circuit as claimed in claim 36, wherein said non-linear element is a diode and said attenuation element comprises a plurality of resistors arranged in a K-type circuit.

* * * * *